United States Patent

Shiozaki et al.

[11] Patent Number: 5,144,147
[45] Date of Patent: Sep. 1, 1992

[54] ION IMPLANTATION APPARATUS AND METHOD OF CLEANING THE SAME

[75] Inventors: Masakazu Shiozaki, Yamato; Katsuya Okumura, Yokohama, both of Japan

[73] Assignee: Kabushiki Kaisha Toshiba, Kawasaki, Japan

[21] Appl. No.: 750,949

[22] Filed: Aug. 28, 1991

[30] Foreign Application Priority Data

Aug. 31, 1990 [JP] Japan .................. 2-230078

[51] Int. Cl.$^5$ .............................................. H01J 37/36
[52] U.S. Cl. .................................................. 250/492.2
[58] Field of Search ............. 250/492.2, 492.21, 492.3, 250/397

[56] References Cited

U.S. PATENT DOCUMENTS

| | | | |
|---|---|---|---|
| 3,983,402 | 9/1976 | Arndt, Jr. et al. | 250/492.21 |
| 4,361,762 | 11/1982 | Douglas | 250/492.21 |
| 4,585,945 | 4/1986 | Bruel et al. | 250/492.21 |
| 4,857,137 | 8/1989 | Tachi | 156/640 |

OTHER PUBLICATIONS

Abstract of Japanese Appln. No. 61-047048 dated Mar. 7, 1986, Patent Abstract of Japan, vol. 10, No. 205 dated Jul. 17, 1986 (E-420) [2261].
Abstract of Japanese Appln. No. 61-135037 dated Jun. 23, 1986, Patent Abstract of Japan, vol. 10, No. 329 dated Nov. 8, 1986 (E-452) [2385].

Primary Examiner—Jack I. Berman
Assistant Examiner—Kiet T. Nguyen
Attorney, Agent, or Firm—Finnegan, Henderson, Farabow, Garrett and Dunner

[57] ABSTRACT

The present invention is directed to the cleaning of an ion implantation apparatus. The ion implantation apparatus of the present invention comprises a sample holder 21 and a gauge 23 acting as a passageway of an ion beam running toward a sample held by the sample holder. The gauge is provided with a gas inlet port 25 for introducing a reactive gas into the ion beam passageway. The reactive gas collides against the ion beam within the ion beam passageway so as to be ionized. The ionized reactive permits removing a stain attached to the ion implantation apparatus. If the ion implantation apparatus further comprises a bias source 26 for applying voltage of a desired polarity to the gauge, the cleaning can be performed more efficiently.

6 Claims, 3 Drawing Sheets

ION IMPLANTATION APPARATUS AND METHOD OF CLEANING THE SAME

BACKGROUND OF THE INVENTION

1. Field of the Invention

The present invention relates to an ion implantation apparatus and a method of cleaning the apparatus.

2. Description of the Related Art

It is widely known to the art that an ion implantation apparatus is used in the manufacturing process of a semiconductor device. FIG. 1 is a cross sectional view showing the gist portion of an ion implantation apparatus. The drawing of FIG. 1 shows a wafer 11, an ion beam 12, a Faraday gauge 13, a stain 14 and a wafer holder 15.

In many cases, a patterned resist is attached to the wafer 11 in the ion implantation treatment using the apparatus shown in FIG. 1. As a result, sputtering of the resist accompanies the irradiation of the wafer 11 with the ion beam 12, with the result that the stain 14 is attached to the Faraday gauge 13 within the ion implantation apparatus. What should also be noted is that the stain 14 is charged with ions, with the result that insulation breakdown tends to take place in the stain 14. Since the insulation breakdown adversely affects the wafer 11, it is necessary to remove the stain 14.

In order to remove the stain 14 in the conventional apparatus, however, it was necessary to dismantle the apparatus and to manually remove the stain 14 by means of, for example, mechanical polishing.

SUMMARY OF THE INVENTION

An object of the present invention is to provide an ion implantation apparatus which permits automatically cleaning the inner portion without difficulty and to provide a cleaning method of the ion implantation apparatus.

According to the present invention, there is provided an ion implantation apparatus, comprising a sample running toward the sample, said gauge being provided with a gas inlet port for introducing a reactive gas into the ion beam passageway.

The present invention also provides a method of cleaning an ion beam implantation apparatus, in which a reactive gas is introduced into an ion beam passageway during the ion beam irradiation so as to achieve collision between the ion beam and the reactive gas and, thus, to ionize the reactive gas, the ionized reactive gas serving to remove the stain attached to the ion implantation apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
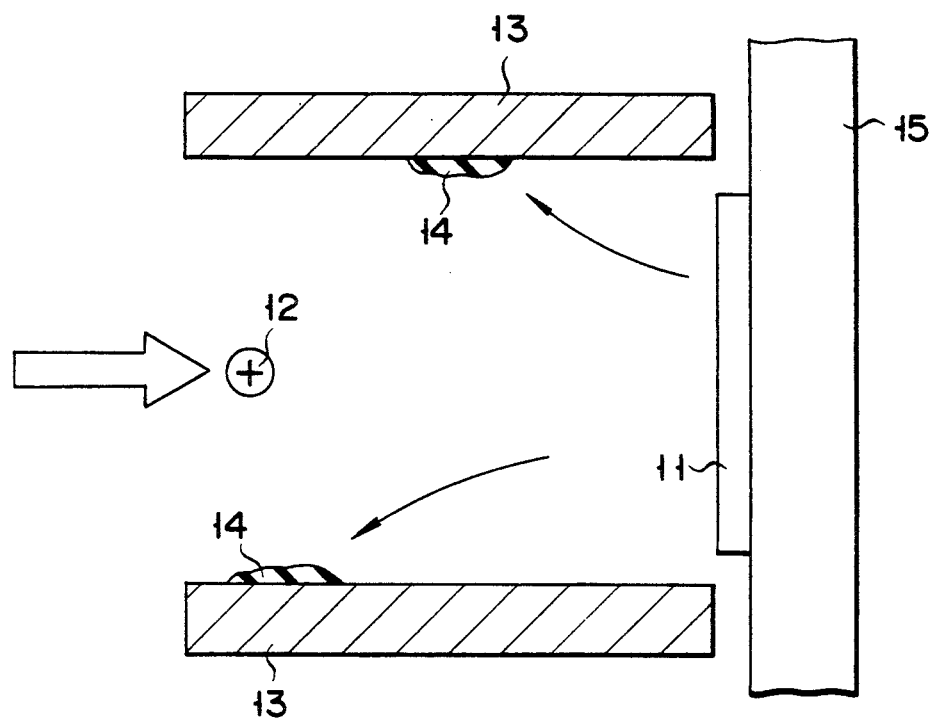
FIG. 1 is a cross sectional view schematically showing a conventional ion implantation apparatus.
Figure 2:
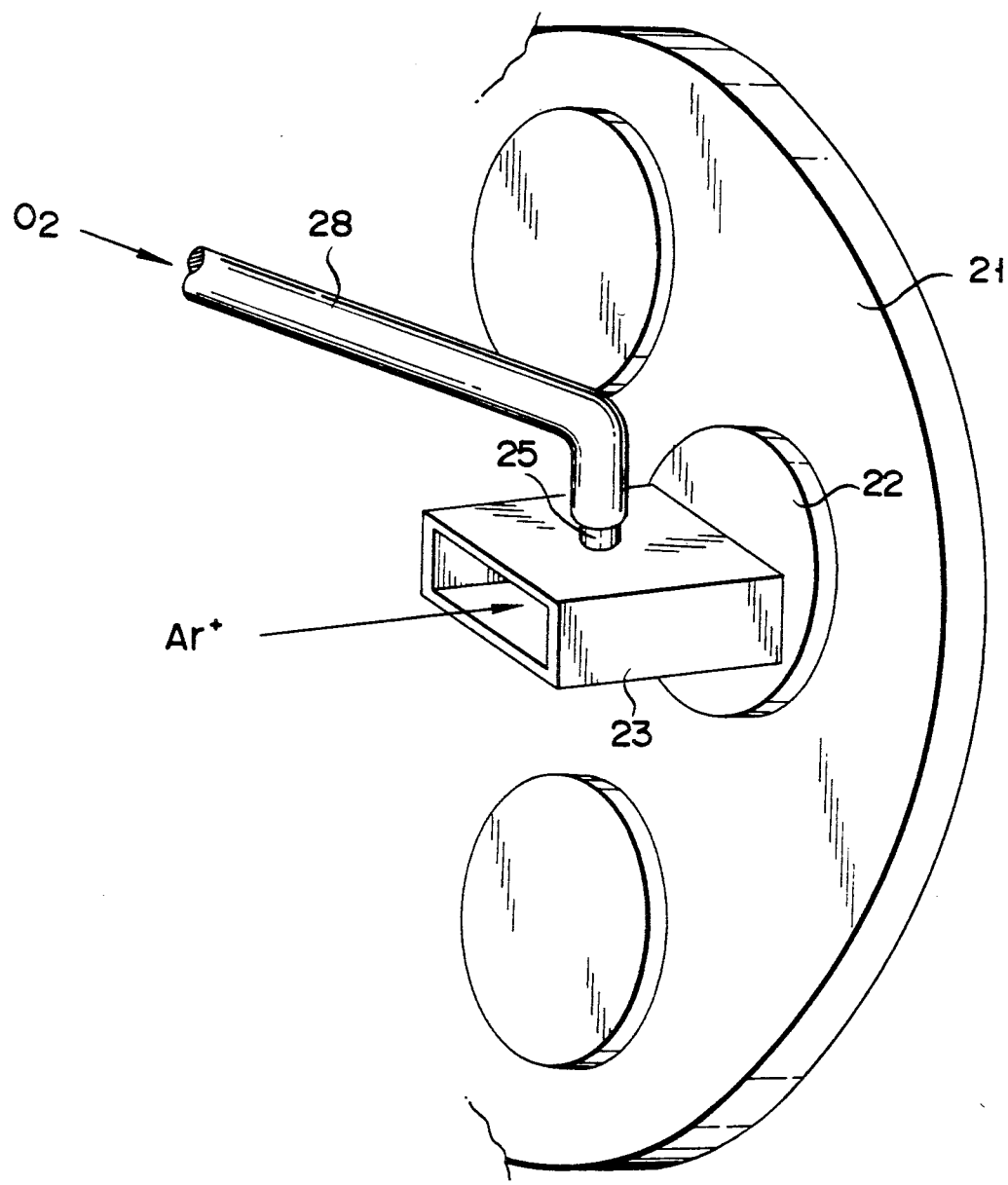
FIG. 2 is an oblique view schematically showing an ion implantation apparatus according to one embodiment of the present invention.
Figure 3:
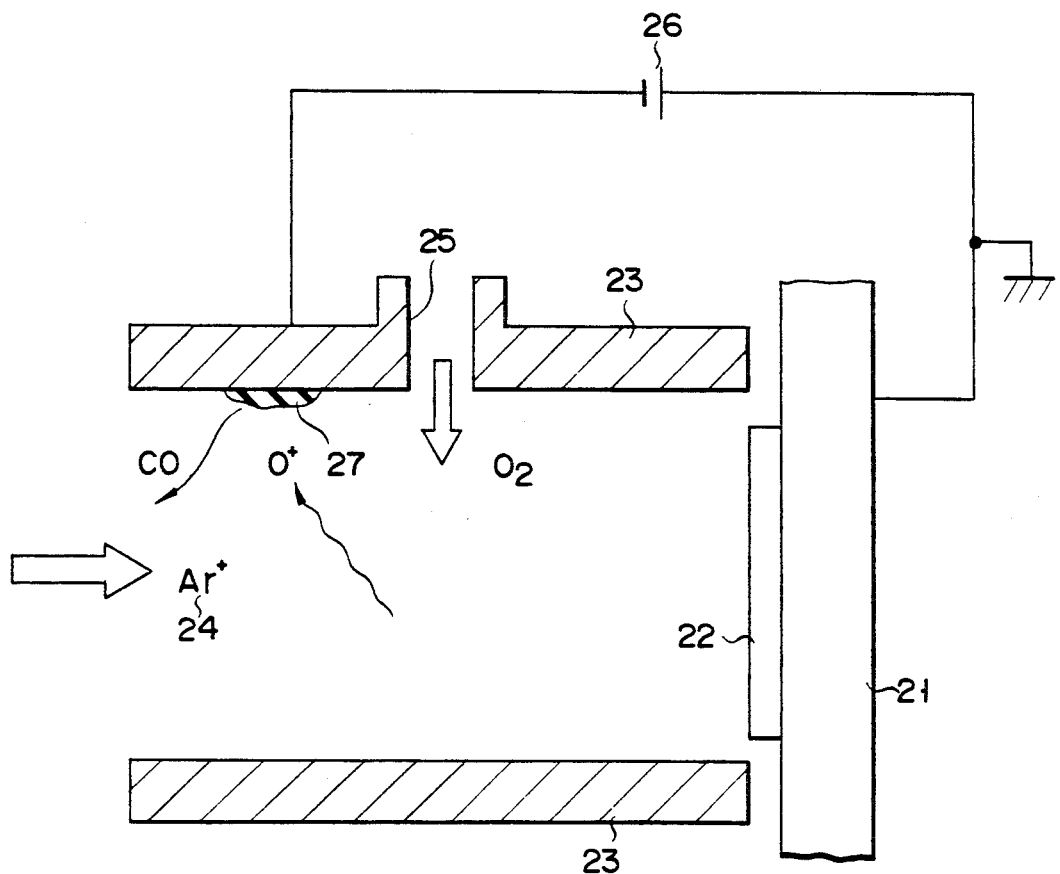
FIG. 3 is a cross sectional view schematically showing the ion implantation apparatus shown in FIG. 2.

FIGS. 2 and 3 collectively show an ion implantation apparatus according to one embodiment of the present invention. As shown in the drawings, the apparatus comprises a wafer holder 21 holding a wafer 22. A Faraday gauge 23 is disposed in the vicinity of the wafer 22. An ion beam, e.g., an argon ion beam $Ar+24$, runs through the Faraday gauge 23 so as to strike the wafer 22. The Faraday gauge 23 is provided with a gas inlet port 25 for introducing a reactive gas, e.g., an oxygen gas ($O_2$), into the argon ion beam passageway formed within the Faraday gauge 23. As shown in FIG. 2, a gas inlet pipe 28 is connected at one end to the gas inlet port 25. The other end of the pipe 28 is connected to, for example, a gas bottle (not shown). Further, a bias source 26 for applying a negative bias is connected to the Faraday gauge 23, as shown in FIG. 3.

As described above, the Faraday gauge 23 is provided with the gas inlet port 25, making it possible to introduce an oxygen gas through the gas inlet port 25 into the argon ion beam passageway formed within the Faraday gauge 23. The oxygen gas introduction produces a prominent effect. Specifically, a stain 27 attached to the Faraday gauge 23 consists mainly of carbon. On the other hand, the reactive gas, e.g., oxygen gas or fluorine gas, introduced into the ion beam passageway is ionized by the beam 24. What should be noted is that the resultant oxygen ions $O^+$ or fluorine ions $F^+$ readily react with the carbon contained in the stain 27. In addition, the reaction product, e.g., carbon monoxide, is volatile, making it possible to readily discharge the reaction product by means of, for example, a vacuum pump. It follows that the stain 27 can be automatically removed without dismantling the apparatus. It should be noted that, if the Faraday gauge 23 is connected to the bias source 26 for applying a negative bias to the Faraday gauge 23, these ions $O^+$, $F^+$ can be attracted toward the Faraday gauge 23, making it possible to more effectively clean the inner region of the apparatus.

Let us describe more in detail the method of the present invention for cleaning the ion implantation apparatus with reference to FIGS. 2 and 3. In the first step, about 5 mA of the argon ion beam 24 is emitted toward the wafer 22 held by the wafer holder 21, followed by introducing an oxygen gas through the gas inlet port 25 into the passageway of the argon ion beam 24. As a result, the oxygen gas collides against the argon ion beam 24 so as to be ionized. The ionized oxygen gas is attracted toward the Faraday gauge 23 to which is applied a negative bias, with the result that the oxygen ions react with the stain 27 consisting mainly of carbon. The reaction product is discharged by means of, for example, a vacuum pump.

The ion implantation apparatus was actually cleaned by the method described above, with the inner pressure of the apparatus maintained at about $1 \times 10^5$ Torr. It was found possible to remove substantially completely the stain 27 attached to the Faraday gauge 23. When a negative bias of −1000 V was applied to the Faraday gauge 23, it was found possible to promote the cleaning function.

In the embodiment described above, the argon ion beam 24 was used as the ion beam. However, it is also possible to use other ion beams such as a neon ion beam or a xenon ion beam in place of the argon ion beam 24. Further, it is possible to use $O_3$, $NF_3$, $CF_4$, or $C_2F_6$ in place of $O_2$ as a reactive gas introduced through the gas inlet port 25, with substantially the same effect.

In the conventional manual cleaning operation, much time is required for dismantling and assembling the apparatus, with the result that about half a day is required for finishing the cleaning operation. In the present invention, however, the cleaning can be performed by simply introducing a reactive gas into the apparatus through a gas inlet port. Thus, the cleaning operation can be finished in about an hour, leading to a marked improvement in the through-put of the ion implantation apparatus.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An ion implantation apparatus, comprising a sample holder and a gauge acting as a passageway of an ion beam running toward the sample, said gauge being provided with a gas inlet port for introducing a reactive gas into the ion beam passageway to remove a stain attached to said gauge.

2. The ion implantation apparatus according to claim 1, which further comprises a bias source for applying voltage of a desired polarity to the gauge.

3. A method of cleaning an ion beam implantation apparatus including a gauge having a gas inlet port, said method comprising introducing a reactive gas through said gas inlet port into an ion beam passageway during the ion beam irradiation so as to achieve collision between the ion beam and the reactive gas and, thus, to ionize the reactive gas, the ionized reactive gas serving to remove a stain attached to said gauge in the ion implantation apparatus.

4. The method of cleaning an ion implantation apparatus according to claim 3, wherein said ion beam is an argon ion beam.

5. The method of cleaning an ion implantation apparatus according to claim 3, wherein said reactive gas is one of the gases selected from the group consisting of $O_2$, $O_3$, $NF_3$, $CF_3$ and $C_2F_6$.

6. The method of cleaning an ion implantation apparatus according to claim 3, wherein said stain consists mainly of carbon.

* * * * *